(12) United States Patent
Devta-Prasanna et al.

(10) Patent No.: US 8,627,160 B2
(45) Date of Patent: Jan. 7, 2014

(54) SYSTEM AND DEVICE FOR REDUCING INSTANTANEOUS VOLTAGE DROOP DURING A SCAN SHIFT OPERATION

(75) Inventors: Narendra Devta-Prasanna, San Jose, CA (US); Sandeep Kumar Goel, West Hollywood, CA (US); Arun K Gunda, San Jose, CA (US)

(73) Assignee: LSI Corporation, San Jose, CA (US)

( * ) Notice: Subject to any disclaimer, the term of this patent is extended or adjusted under 35 U.S.C. 154(b) by 598 days.

(21) Appl. No.: 12/727,241

(22) Filed: Apr. 21, 2010

(65) Prior Publication Data
US 2011/0260767 A1    Oct. 27, 2011

(51) Int. Cl.
*G01R 31/28*    (2006.01)

(52) U.S. Cl.
USPC .......................................... 714/726; 714/724

(58) Field of Classification Search
USPC ......... 714/726, 731, 744, 738, 724, 798, 815, 714/30; 713/503, 400, 401, 500, 501; 327/285, 152, 297, 298, 141, 144; 377/106; 326/93
See application file for complete search history.

(56) References Cited

U.S. PATENT DOCUMENTS

| 5,257,223 | A * | 10/1993 | Dervisoglu | 365/154 |
| 7,284,143 | B2 * | 10/2007 | Song et al. | 713/503 |
| 7,320,098 | B2 | 1/2008 | Shin | |
| 7,401,277 | B2 | 7/2008 | Yamada et al. | |
| 7,868,679 | B2 * | 1/2011 | Riedel et al. | 327/261 |
| 7,895,488 | B1 * | 2/2011 | Bertanzetti | 714/728 |
| 7,944,241 | B1 * | 5/2011 | Sharma et al. | 326/93 |
| 7,952,390 | B2 * | 5/2011 | Takatori et al. | 326/93 |
| 7,954,000 | B2 | 5/2011 | Allen et al. | |
| 8,407,540 | B2 * | 3/2013 | Chandra | 714/726 |
| 2003/0154455 | A1 | 8/2003 | Yoshida | |
| 2005/0055614 | A1 | 3/2005 | Yeh | |
| 2005/0071707 | A1 * | 3/2005 | Hampel | 713/600 |
| 2009/0119552 | A1 | 5/2009 | Chelstrom et al. | |

FOREIGN PATENT DOCUMENTS

| EP | 1221700 A1 | 7/2002 |
| EP | 1643257 A1 | 4/2006 |
| TW | 200624833 | 7/2006 |
| TW | 200819769 A | 5/2008 |
| WO | WO2008108902 A1 | 9/2008 |

OTHER PUBLICATIONS

The Notice of Preliminary Rejection; Mailed Aug. 30, 2012 for corresponding KR Application No. 2010-0086672.

(Continued)

*Primary Examiner* — Phung M Chung
(74) *Attorney, Agent, or Firm* — Mendelsohn, Drucker & Dunleavy, P.C.; Steve Mendelsohn (57) ABSTRACT

A system and device for reducing instantaneous voltage droop (IVD) during a scan shift operation. In one embodiment, a system includes a first group of clock gating cells configured to receive an input clock signal and a first group of flip-flops coupled to the first group of clock gating cells. Each clock gating cell of the first group of clock gating cells includes a first delay element to delay the input clock signal by a first duration during a scan shift operation. The system also includes a second group of clock gating cells configured to receive the input clock signal, and a second group of flip-flops coupled to the second group of clock gating cells. Each clock gating cell of the second group of clock gating cells includes a second delay element to delay the input clock signal by a second duration during the scan shift operation.

18 Claims, 7 Drawing Sheets

(56) References Cited

OTHER PUBLICATIONS

Sobeech Almukhaizim et al., "Dynamic Scan Chain Partitioning for Reducing Peak Shift Power During Test," IEEE Transaction on Computer-Aided Design of Integrated Circuits and Systems, vol. 28, No. 2, pp. 298-302, Feb. 2009.

Notice of Reason for Rejection; Mailed Dec. 21, 2012 for corresponding JP Application No. 2010-196947.

Gonzalez, D., et al., "Improved Clock Distribution Strategy for RNS-based DSP VLSI Systems", Proc. of XVIII Conference on Design of Circuits and Integrated Systems (DCIS'2003) Nov. 2003, pp. 256-260.

"Spread Spectrum Clock Generation Technology", Lexmark International, Inc., 2003; pp. 1-2.

Regan, T., et al., "Easy-to-use spread spectrum clock generator reduces EMI and more", Linear Technol. Mag., 2004, pp. 6-12.

Gonzalez, D., et al., "Efficient Clock Distribution Scheme for VLSI RNS-Enabled Controllers", Power and Timing Modeling, Optimization and Simulation Lecture Notes in Computer Science, vol. 3728, 2005, pp. 657-665.

"Timing-Safe Spread Spectrum EMI Reduction", AND8443/D, Dec. 2010, pp. 1-4.

Kaplan, Y., et al., "Post optimization of a clock tree for power supply noise reduction," 2012 IEEE 27th Convention ofElectrical & Electronics Engineers in Israel (IEEEI), pp. 1,5, Nov. 14-15, 2012.

Rice, J., et al., "Understanding Noise-Spreading Techniques and Their Effects in Switch-Mode Power Applications", Topic 2, 2011, pp. 2-1-2-26.

Chinese Office Action; Mailed Apr. 10, 2013 for the corresponding CN Application No. 201010287489.7, (No English translation).

Taiwan Office Action; Mailed Jun. 11, 2013 for corresponding TW Application No. 099129505.

* cited by examiner

SYSTEM AND DEVICE FOR REDUCING INSTANTANEOUS VOLTAGE DROOP DURING A SCAN SHIFT OPERATION

FIELD OF TECHNOLOGY

Embodiments of the present invention relate to the field of electronics. More particularly, embodiments of the present invention relate to design for test (DFT) systems and devices.

BACKGROUND

A scan design is a technique used in design for test (DFT). A scan chain may be formed in a chip, such as system-on-chip, by connecting every flip-flop in the chip as a long shift register when a scan mode or scan test mode is asserted. During the scan mode, a scan shift operation or a scan capture operation may be performed. When the scan shift operation is enabled, one input pin may be used to load a serial input of test pattern to the scan chain. While the scan shift operation is ongoing, the normal operation of the chip may be ceased. During the ensuing scan capture operation, the normal operation of the chip may be performed based on the test pattern in the scan chain as well as functional inputs to combinational circuits in the chip. Then, the result of the scan capture operation may be shifted out during the subsequent scan shift operation, where the result may be compared with the expected test pattern to verify the sound operation of the chip.

As all the flip-flops in the chip perform shifting of the test pattern according to an input clock signal or scan clock signal from a tester (e.g., external tester), the simultaneous shifting or switching of the flip-flops may cause high instantaneous voltage droop (IVD) in the power grid, which is used to supply power to various circuit elements of the chip. The high IVD may impede a faster completion of the scan shift operation, thus causing an additional chip testing time and/or cost.

Consequently, there have been a number of approaches to reduce the IVD. In one such approach, a test pattern which is loaded into the scan chain may be modified to reduce the IVD. For example, 0-fill and/or 1-fill may be an automatic test pattern generation (ATPG) technique employed to reduce the number of flip-flop transitions during the scan shift operation. Although the technique may be effective in reducing the IVD, more test patterns, thus more testing time, may be required to compensate for the modification of the test patterns with extra 0's and 1's.

Alternatively, the design of the chip may be modified to reduce the IVD. For example, in a flip-flop output gating technique, flip-flop outputs may be gated off during the scan shift operation so that circuit elements (e.g., logic gates in combinational circuits) driven by the flip-flop outputs may not see any changes in the flip-flops during the scan shift operation. In another example, the flip-flops in the scan chain may be designed to have separate output pins for functional and scan connections. As a result, the functional outputs of the flip-flops may not change during the scan shift operation, thus reducing the IVD. However, both of the techniques may require additional hardware and/or degrade the performance of the chip.

SUMMARY

A system and device for reducing instantaneous voltage droop (IVD) during a scan shift operation is disclosed. According to one aspect of the present invention, a system for reducing IVD during a scan shift operation of a logic device includes a first group of clock gating cells configured to receive an input clock signal. Each clock gating cell of the first group of clock gating cells includes a first delay element configured to delay the input clock signal by a first duration during the scan shift operation. Further, the system includes a first group of flip-flops coupled to the first group of clock gating cells.

The system also includes a second group of clock gating cells configured to receive the input clock signal. Each clock gating cell of the second group of clock gating cells includes a second delay element configured to delay the input clock signal by a second duration during the scan shift operation. Further, the system includes a second group of flip-flops coupled to the second group of clock gating cells, where the first group of flip-flops and the second group of flip-flops are configured to receive the input clock signal delayed by the first duration and the input clock signal delayed by the second duration, respectively, during the scan shift operation.

In another aspect of the present invention, a system for reducing IVD during a scan shift operation of a logic device includes a first group of clock gating cells configured to receive an input clock signal, where each clock gating cell of the first group of clock gating cells includes a first delay element configured to delay the input clock signal by a first duration during the scan shift operation. The system further includes a first group of bypass multiplexers coupled to the first group of clock gating cells and configured to forward the input clock signal delayed by the first duration during the scan shift operation, and a first group of flip-flops coupled to the first group of bypass multiplexers.

The system also includes a second group of clock gating cells configured to receive the input clock signal, where each clock gating cell of the second group of clock gating cells includes a second delay element configured to delay the input clock signal by a second duration during the scan shift operation. Furthermore, the system includes a second group of bypass multiplexers coupled to the second group of clock gating cells and configured to forward the input clock signal delayed by the second duration during the scan shift operation, and a second group of flip-flops coupled to the second group of bypass multiplexers. The first group of flip-flops and the second group of flip-flops are configured to receive the input clock signal delayed by the first duration and the input clock signal delayed by the second duration, respectively, during the scan shift operation.

In yet another aspect, a device for reducing IVD during a scan shift operation of a logic device includes a first group of clock gating cells configured to receive an input clock signal and a first group of flip-flops coupled to the first group of clock gating cells, where each clock gating cell of the first group of clock gating cells includes a first programmable delay element configured to delay the input clock signal by a first duration during the scan shift operation.

The device further includes a second group of clock gating cells configured to receive the input clock signal and a second group of flip-flops coupled to the second group of clock gating cells, where each clock gating cell of the second group of clock gating cells includes a second programmable delay element configured to delay the input clock signal by a second duration during the scan shift operation. The first group of flip-flops and the second group of flip-flops are configured to receive the input clock signal delayed by the first duration and the input clock signal delayed by the second duration, respectively, during the scan shift operation. Furthermore, the device includes a feedback circuit coupled to the first programmable delay element and the second programmable delay element and configured to calculate the first duration and the second duration based on the IVD.

The systems and devices disclosed herein may be implemented in any means for achieving various aspects, and other features will be apparent from the accompanying drawings and from the detailed description that follow.

BRIEF DESCRIPTION OF THE DRAWINGS

Various preferred embodiments are described herein with reference to the drawings, wherein.

The drawings described herein are for illustration purposes only and are not intended to limit the scope of the present disclosure in any way.

DETAILED DESCRIPTION

A system and device for reducing instantaneous voltage droop (IVD) during a scan shift operation is disclosed. In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
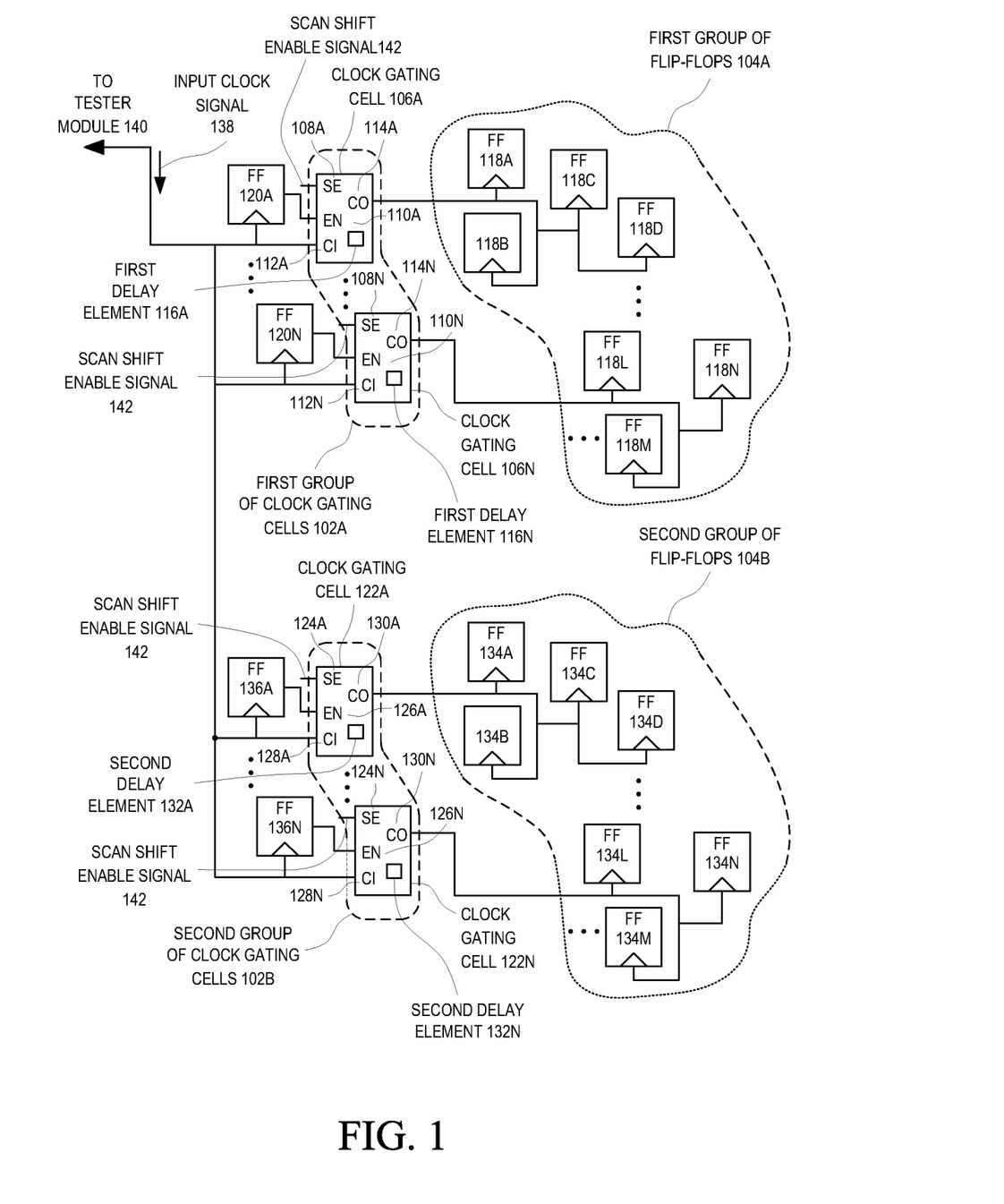
FIG. 1 illustrates an exemplary system for reducing IVD during a scan shift operation of a logic device, according to one embodiment.

FIG. 1 illustrates an exemplary system 100 for reducing instantaneous voltage droop (IVD) during a scan shift operation of a logic device (e.g., a system on chip, etc.) according to one embodiment. In FIG. 1, the system 100 includes a first group of clock gating cells 102A, a second group of clock gating cells 102B, a first group of flip-flops 104A, and a second group of flip-flops 104B. The first group of clock gating cells 102A includes clock gating cells (CGCs) 106A-N, and the second group of clock gating cells 102B includes a clock gating cells (CGCs) 122A-N.

The clock gating cells 106A-N include first delay elements 116A-N, respectively. The clock gating cells 122A-N include second delay elements 132A-N, respectively. Each of the first delay elements 116A-N and the second delay elements 132A-N may be a delay buffer. The first group of flip-flops 104A includes flip-flops 118A-N, and the second group of flip-flops 104B includes flip-flops 134A-N. In one embodiment, the first group of flip-flops 104A and the second group of flip-flops 104B may include a substantially equal number of flip-flops.

Although, FIG. 1 shows the system 100 including the first group of clock gating cells 102A and the second group of clock gating cells 102B, it is appreciated that the system 100 may include more than two groups of clock gating cells, where each group of clock gating cells shares a delay element of an equal duration and is coupled to a group of flip-flops.

As shown, clock input (CI) pins or nodes 112A-N of the first group of clock gating cells 102A and clock input (CI) pins 128A-N of the second group of clock gating cells 102B are configured to receive an input clock signal 138. The input clock signal 138 may be a clock signal generated and forwarded by a tester module 140 (e.g., an external tester) connected to the system 100. Further, scan shift enable (SE) pins or nodes 108A-N of the first group of clock gating cells 102A and scan shift enable (SE) pins 1124A-N of the second group of clock gating cells 102B are configured to receive a scan shift enable (SE) signal 142.

Further, enable (EN) pins or nodes 110A-N of the first group of clock gating cells 102A are configured to receive a functional mode enable signal from outputs of flip-flops 120A-N. Similarly, enable (EN) pins or nodes 126A-N of the second group of clock gating cells 102B are configured to receive a functional mode enable signal from outputs of flip-flops 136A-N. Furthermore, as illustrated, clock output (CO) pins or nodes 114A-N of the first group of clock gating cells 102A are coupled to the first group of flip-flops 104A, and clock output (CO) pins or nodes 130A-N of the second group of clock gating cells 102B are coupled to the second group of flip-flops 104B.

In one exemplary operation, when a scan mode of the logic device is asserted, a scan shift operation and a scan capture operation are performed by the system 100. The scan shift operation is enabled when the SE signal 142 is logical high. During the scan shift operation, using their respective first delay elements 116A-N, the clock gating cells 106A-N of the first group of clock gating cells 102A provides the input clock signal 138 delayed by a first duration (e.g., in nanoseconds) to the first group of flip-flops 104A via respective CO pins 114A-N. In one embodiment, the first delay elements 116A-N are configured to delay the input clock signal 138 by the first duration during the scan shift operation.

Similarly, during the scan shift operation of the logic device, the second delay elements 132A-N of the second group of clock gating cells 102B are configured to delay the input clock signal 138 by a second duration (e.g., in nanoseconds). It is appreciated that the second duration is not equivalent to the first duration. As a result, the second group of clock gating cells 102B provides the input clock signal 138 delayed by the second duration to the second group of flip-flops 104B during the scan shift operation.

As the input clock signal 138 to the first group of flip-flops 104A is delayed by the first duration and the input clock signal 138 to the second group of flip-flops 104B is delayed by the second duration during the scan shift operation, the flip-flops 118A-N perform their shift operations at a different instance than the instance the flip-flops 134A-N perform their shift operations. As the two groups of flip-flops perform their shift operations at two different instances, the load to the power grid of the logic device is divided between the two groups of flip-flops. Subsequently, this may help significantly reduce the IVD in the power grid of the logic device during its scan shift operation, thus enabling faster completion of the scan shift operation.

Following the scan shift operation, the scan capture operation is performed. The scan capture operation is enabled when the SE signal 142 is logical low and the functional mode enable signal is logical high. During the scan capture operation, the first group of clock gating cells 102A provide the input clock signal 138 without delay to the first group of flip-flops 104A, and the second group of clock gating cells 102B provide the input clock signal 138 without delay to the second group of flip-flops 104B. Further, a subsequent scan shift operation is performed during which the result of the scan capture operation is shifted out of the first group of flip-flops 104A and the second group of flip-flops 104B and another test pattern data is shifted in the first group of flip-flops 104A and the second group of flip-flops 104B. During the subsequent scan shift operation, the input clock signal 138 fed to the first group of flip-flops 104A is delayed by the first duration and the input clock signal 138 fed to the second group of flip-flops 104B is delayed by the second duration.

Figure 2A:
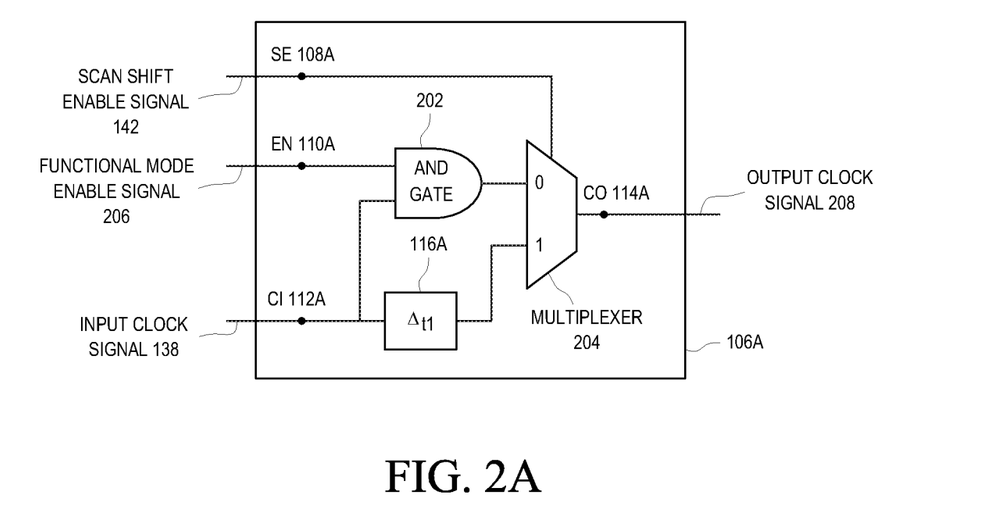
FIG. 2A illustrates an exemplary circuit of a clock gating cell with a first delay element in FIG. 1.

FIG. 2A illustrates an exemplary circuit of the clock gating cell 106A in FIG. 1. In FIG. 2A, the clock gating cell 106A includes the first delay element 116A, an AND gate 202, and a multiplexer 204. The multiplexer 204 is coupled to the first delay element 116A and the AND gate 202. The first delay element 116A is configured to receive the input clock signal 138 from the tester module 140 and to delay the input clock signal 138 by a first duration ($\Delta_{t1}$). Further, the first delay element 116A is configured to forward the input clock signal 138 delayed by the first duration ($\Delta_{t1}$) to the multiplexer 204. The AND gate 202 is configured to receive a functional mode enable signal 206 and the input clock signal 138 as inputs and to generate a logical value '0' or '1' based on the inputs. The output of the AND gate 202 is fed as an input to the multiplexer 204.

When a scan shift operation is enabled, the SE signal 142 applied to the SE pin 108A is logical high. During the scan shift operation, the multiplexer 204 is configured to select the input clock signal 138 delayed by the first duration ($\Delta_{t1}$) as an output clock signal 208 based on the SE signal 142 (logical high). Alternatively, when a scan capture mode is asserted, the SE signal 142 applied to the SE pin 108A is logical low. Further, the functional mode enable signal 206 applied to the EN pin 110A is logical high. Thus, during the scan capture operation, the multiplexer 204 is configured to select the input clock signal 138 as the output clock signal 208 based on the SE signal 142 (logical low).

Figure 2B:
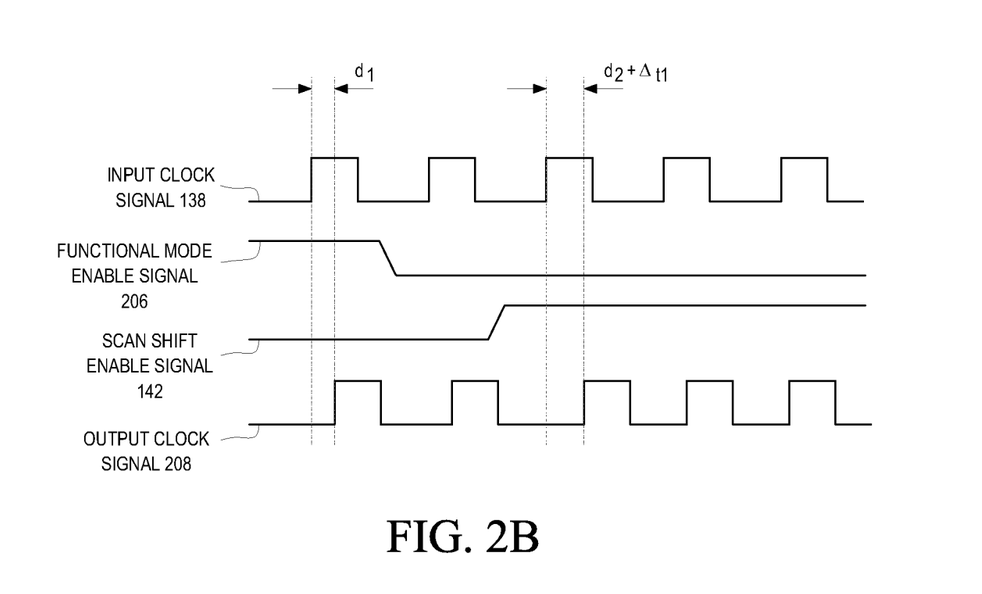
FIG. 2B illustrates a timing diagram of various signals fed to the system in FIG. 1.

FIG. 2B illustrates a timing diagram of various signals fed to the system 100 in FIG. 1. In particular, FIG. 2B shows a timing diagram of the input clock signal 138, the functional mode enable signal 206, the SE signal 142, and the output clock signal 208. During the scan capture operation, the functional mode enable signal 206 is logical high and the SE signal 142 is logical low, as shown in FIG. 2B. Further, it can be seen in FIG. 2B that, the output clock signal 208 of the clock gating cell 106A includes an output delay of d1 (e.g., in nanoseconds). The output delay (d1) may be an internal propagation delay associated with the clock gating cell 106A.

During a scan shift operation, the SE signal 142 is logical high and the functional mode enable signal 206 is logical low as shown in FIG. 2B. Further, it can be seen in FIG. 2B that the output clock signal 208 includes an output delay of (d2+$\Delta_{t1}$), where d2 is an internal propagation delay and $\Delta_{t1}$ is a delay of first duration introduced by the first delay element 116A to the input clock signal 138. It is appreciated that the circuit and timing diagram illustrated in FIG. 2A and FIG. 2B may be shared by each of the clock gating cells 106B-N.

Figure 2C:
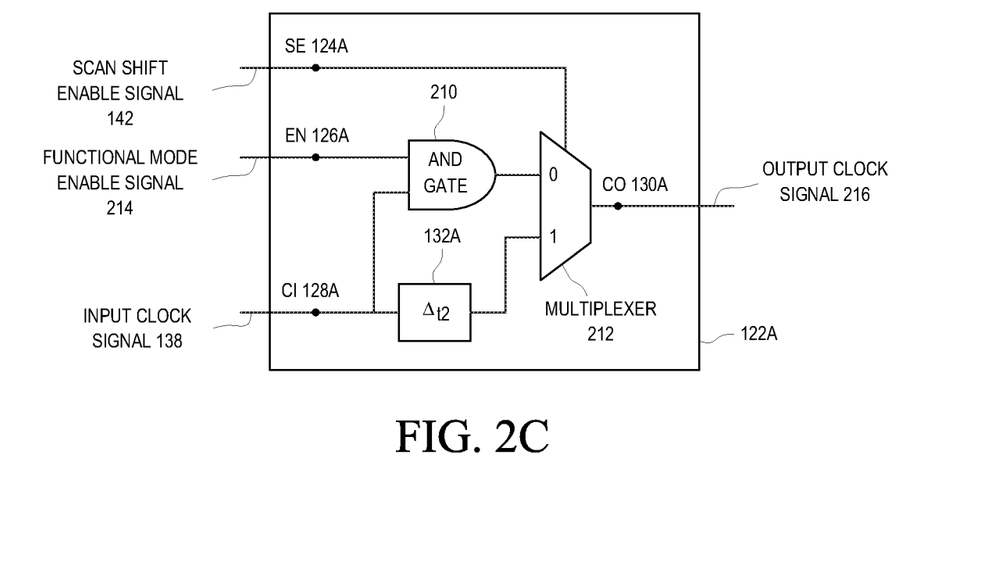
FIG. 2C illustrates an exemplary circuit of a clock gating cell with a second delay element in FIG. 1.

FIG. 2C illustrates an exemplary circuit of the clock gating cell 122A in FIG. 1. In FIG. 2C, the clock gating cell 122A includes the second delay element 132A, an AND gate 210 and a multiplexer 212. The multiplexer 212 is coupled to the first delay element 132A and the AND gate 210. The second delay element 132A is configured to receive the input clock signal 138 from the tester module 140 and to delay the input clock signal 138 by a second duration ($\Delta_{t2}$). Further, the second delay element 132A is configured to forward the input clock signal delayed by the second duration ($\Delta_{t2}$) to the multiplexer 212. The AND gate 210 is configured to receive a functional mode enable signal 214 and the input clock signal 138 as inputs and to generate a logical value '0' or '1' based on the inputs. The output of the AND gate 210 is fed as an input to the multiplexer 212.

When a scan shift operation is enabled, the SE signal 142 applied to the SE pin 124A is logical high. During the scan shift operation, the multiplexer 212 is configured to select the input clock signal 138 delayed by the second duration ($\Delta_{t2}$) as an output clock signal 216 based on the SE signal 142 (logical high). Alternatively, when a scan capture mode is enabled, the SE signal 142 applied to the SE pin 124A is logical low. Further, the functional mode enable signal 214 applied to the EN pin 126A is logical high. Thus, during the scan capture operation, the multiplexer 212 is configured to select the input clock signal 138 as the output clock signal 216 based on the SE signal 142 (logical low).

Figure 2D:
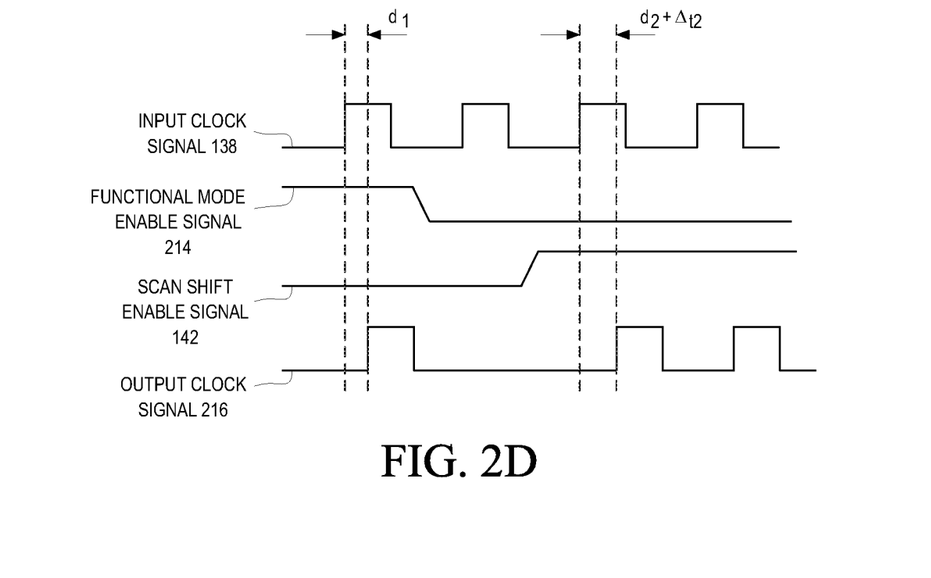
FIG. 2D illustrates a timing diagram of various signals fed to the system in FIG. 1.

FIG. 2D illustrates a timing diagram of various signals fed to the system 100 in FIG. 1. In particular, FIG. 2D shows a timing diagram of the input clock signal 138, the functional mode enable signal 214, the SE signal 142, and the output clock signal 216. During the scan capture operation, the functional mode enable signal 214 is logical high and the SE signal 142 is logical low, as shown in FIG. 2D. Further, it can be seen in FIG. 2D that, the output clock signal 216 of the clock gating cell 122A includes an output delay of d1. The output delay (d1) may be an internal propagation delay associated with the clock gating cell 122A.

During a scan shift operation, the SE signal 142 is logical high and the functional mode enable signal 214 is logical low as shown in FIG. 2D. Further, it can be seen in FIG. 2D that, the output clock signal 216 includes an output delay of (d2+$\Delta_{t2}$), where d2 is an internal propagation delay associated with the clock gating cell 122A and $\Delta_{t2}$ is a delay of second duration introduced by the first delay element 122A to the input clock signal 138. It is appreciated that the circuit and timing diagram illustrated in FIG. 2C and FIG. 2D may be shared by each of the clock gating cells 122B-N. In one embodiment, the delay of second duration ($\Delta_{t2}$) is greater than the delay of first duration ($\Delta_{t1}$). In an alternate embodiment, the delay of first duration ($\Delta_{t1}$) is greater than the delay of first duration ($\Delta_{t1}$). It can be noted that, the delay of first duration and the delay of second duration are based on size of the first delay elements 116A-N and the second delay elements 132A-N, respectively.

Figure 3A:
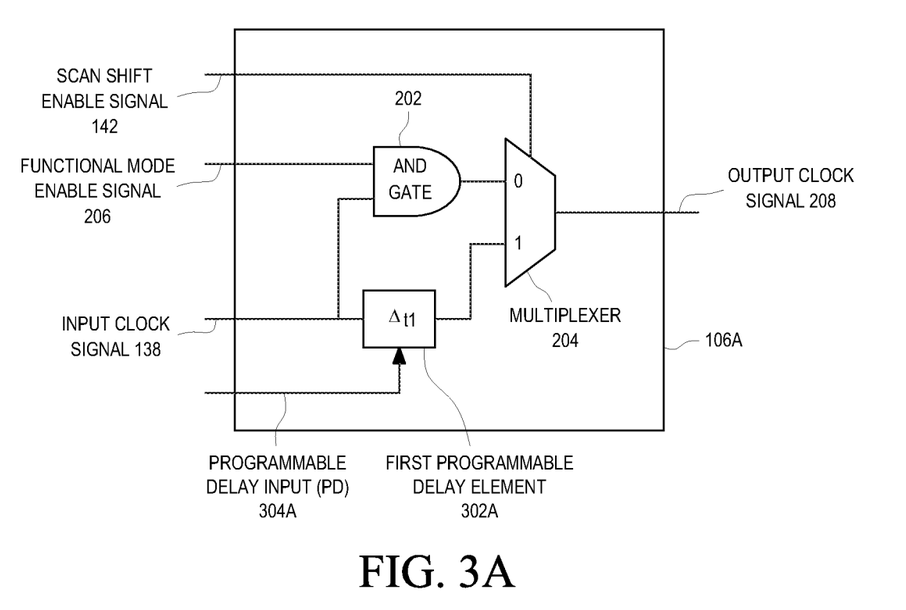
FIG. 3A illustrates another exemplary circuit of the clock gating cell with the first delay element in FIG. 1.

FIG. 3A illustrates another exemplary circuit of the clock gating cell 106A in FIG. 1. The circuit of the clock gating cell 106A in FIG. 3A is similar to the circuit of the clock gating cell 106A of FIG. 2A, except that the circuit in FIG. 3A includes a first programmable delay element 302A instead of the first delay element 116A. In one embodiment, the first programmable delay element 302A is configured to set a first duration ($\Delta_{t1}$) to delay the input clock signal 138 by the first duration ($\Delta_{t1}$) based on a first programmable delay input (PD) 304A (e.g., single bit or multiple bit data). In this embodiment, the first programmable delay element 302A is configured to forward the input clock signal 138 delayed by the first duration ($\Delta_{t1}$) as an input to the multiplexer 204. It is appreciated that the clock gating cells 106B-N in the first group of clock gating cells 102A may also include first programmable delay elements 302B-N (not shown) which are configured to delay the input clock signal 138 by the first duration ($\Delta_{t1}$) based on first programmable delay inputs 304B-N (not shown), respectively.

Figure 3B:
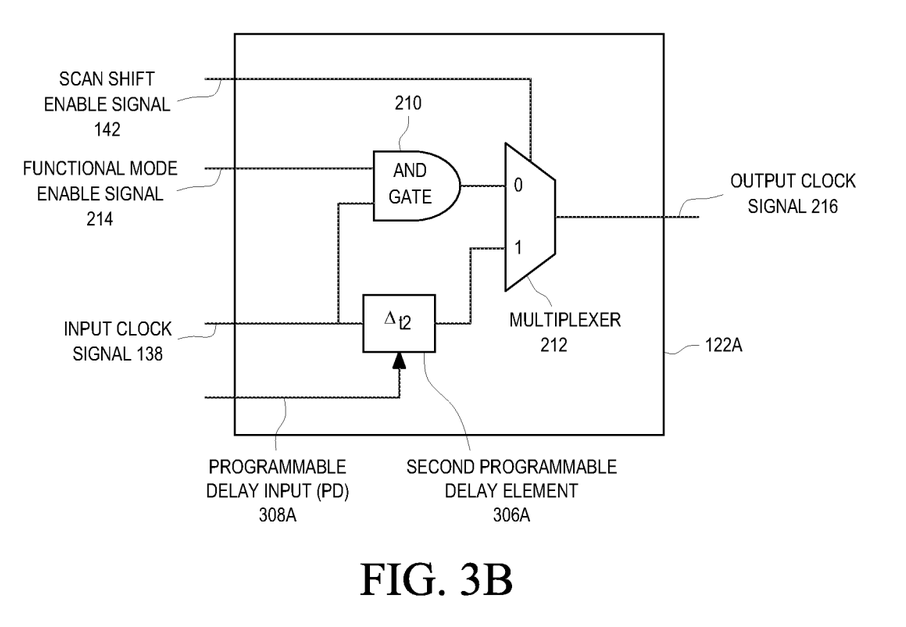
FIG. 3B illustrates another exemplary circuit of the clock gating cell with the second delay element in FIG. 1.

FIG. 3B illustrates another exemplary circuit of the clock gating cells 122A-N in FIG. 1. The circuit of the clock gating cell 122A in FIG. 3B is similar to the circuit of the clock gating cell 122A of FIG. 2B, except that the circuit in FIG. 3B includes a second programmable delay element 306A instead of the second delay element 132A.

In one embodiment, the second programmable delay element 306A is configured to set a second duration ($\Delta_{t2}$) to delay the input clock signal 138 by the second duration ($\Delta_{t2}$) based on a second programmable delay input (PD) 308A (e.g., single bit or multiple bit data). In this embodiment, the second programmable delay element 306A is configured to forward the input clock signal 138 delayed by the second duration ($\Delta_{t2}$) as an input to the multiplexer 204. It is appreciated that the clock gating cells 122B-N in the second group of clock gating cells 102B of the system 100 may include second programmable delay elements 306B-N (not shown) which are configured to delay the input clock signal 138 by the second duration ($\Delta_{t2}$) based on second programmable delay inputs 308B-N (not shown).

Figure 4:
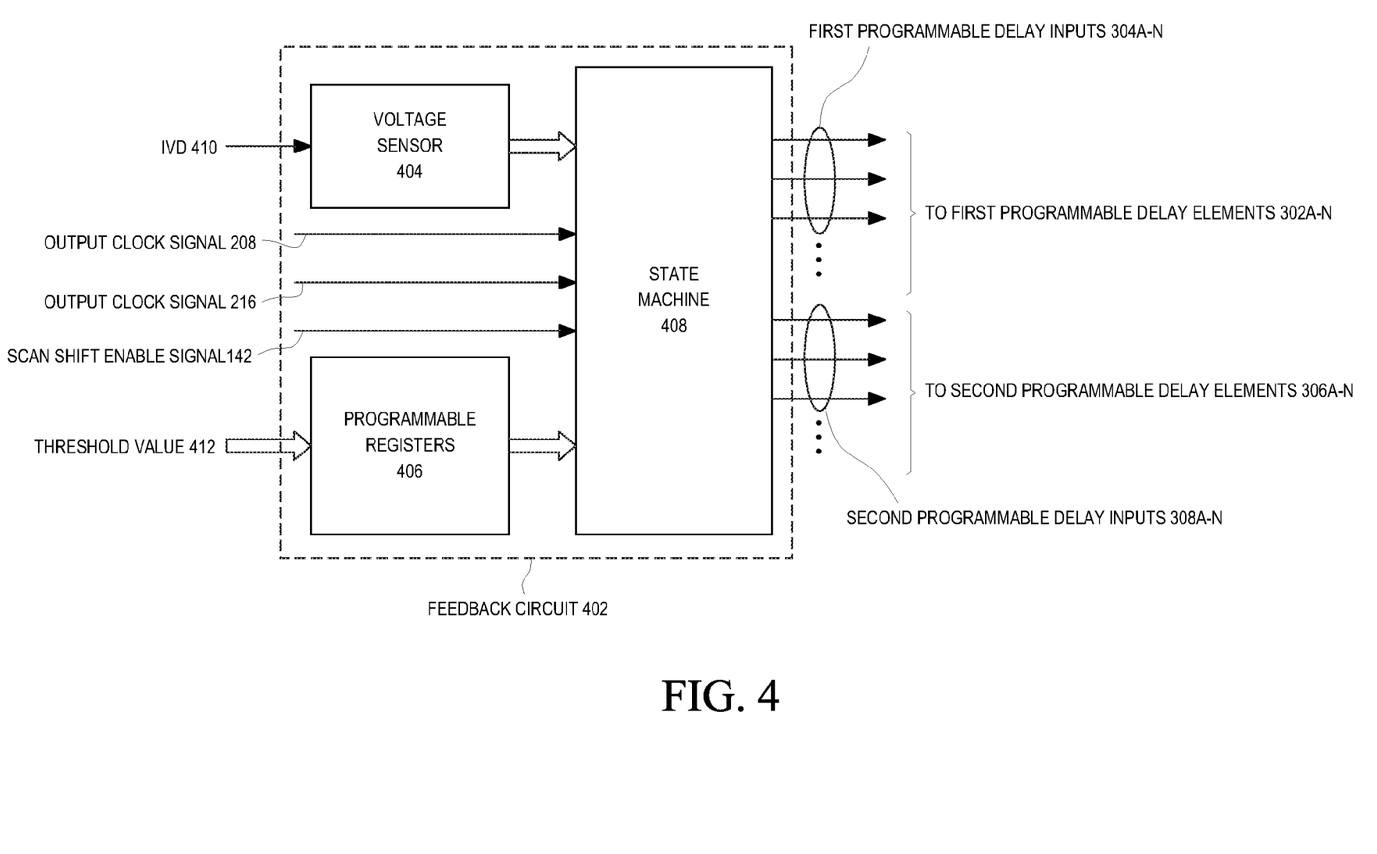
FIG. 4 illustrates an exemplary device for reducing IVD during a scan shift operation of the logic device, according to one embodiment.

FIG. 4 illustrates an exemplary device for reducing IVD during a scan shift operation of a logic device, according to one embodiment. In FIG. 4, the device includes a feedback circuit 402 coupled to the system 100 of FIG. 1. In one example embodiment, the feedback circuit 402 is coupled to the first programmable delay elements 302A-N of the first group of clock gating cells 102A and to the second programmable delay elements 306A-N of the second group of clock gating cells 102B.

In this example embodiment, the feedback circuit 402 calculates a first duration ($\Delta_{t1}$) and a second duration ($\Delta_{t2}$) and forwards the first programmable delay inputs 304A-N associated with the first duration ($\Delta_{t1}$) and the second programmable delay inputs 308A-N associated with the second duration ($\Delta_{t2}$) to the first programmable delay elements 302A-N and to the second programmable delay elements 306A-N, respectively. In an exemplary implementation, the feedback circuit 402 senses the IVD during the scan shift operation and adjusts the first duration ($\Delta_{t1}$) and the second duration ($\Delta_{t2}$) based on the sensed IVD till the IVD in the power grid during the scan shift operation is reduced to an acceptable level.

As shown, the feedback circuit 402 includes a voltage sensor 404, programmable registers 406 and a state machine 408. In the feedback circuit 402, the state machine 408 is coupled to the voltage sensor 404 and to the programmable registers 406. In an exemplary operation, the voltage sensor 404 detects IVD 410 during the scan shift operation. Also, during the scan shift operation, the programmable registers 406 stores a threshold value 412 associated with the IVD 410. Accordingly, the state machine 408 generates the first programmable delay inputs 304A-N and the second programmable delay inputs 308A-N based on one or more of the detected IVD 410, the threshold value 412 associated with the IVD 410, the output clock signal 208, the output clock signal 216, and the scan shift enable signal 142.

The state machine 408 then feeds the first programmable delay inputs 304A-N and the second programmable delay inputs 308A-N to the first delay programmable elements 302A-N and the second programmable delay elements 306A-N, respectively. Accordingly, each of the first programmable delay elements 302A-N and the second programmable delay elements 306A-N sets the first duration ($\Delta_{t1}$) and the second duration ($\Delta_{t2}$) based on the first programmable delay inputs 304A-N and the second programmable delay inputs 308A-N.

Figure 5:
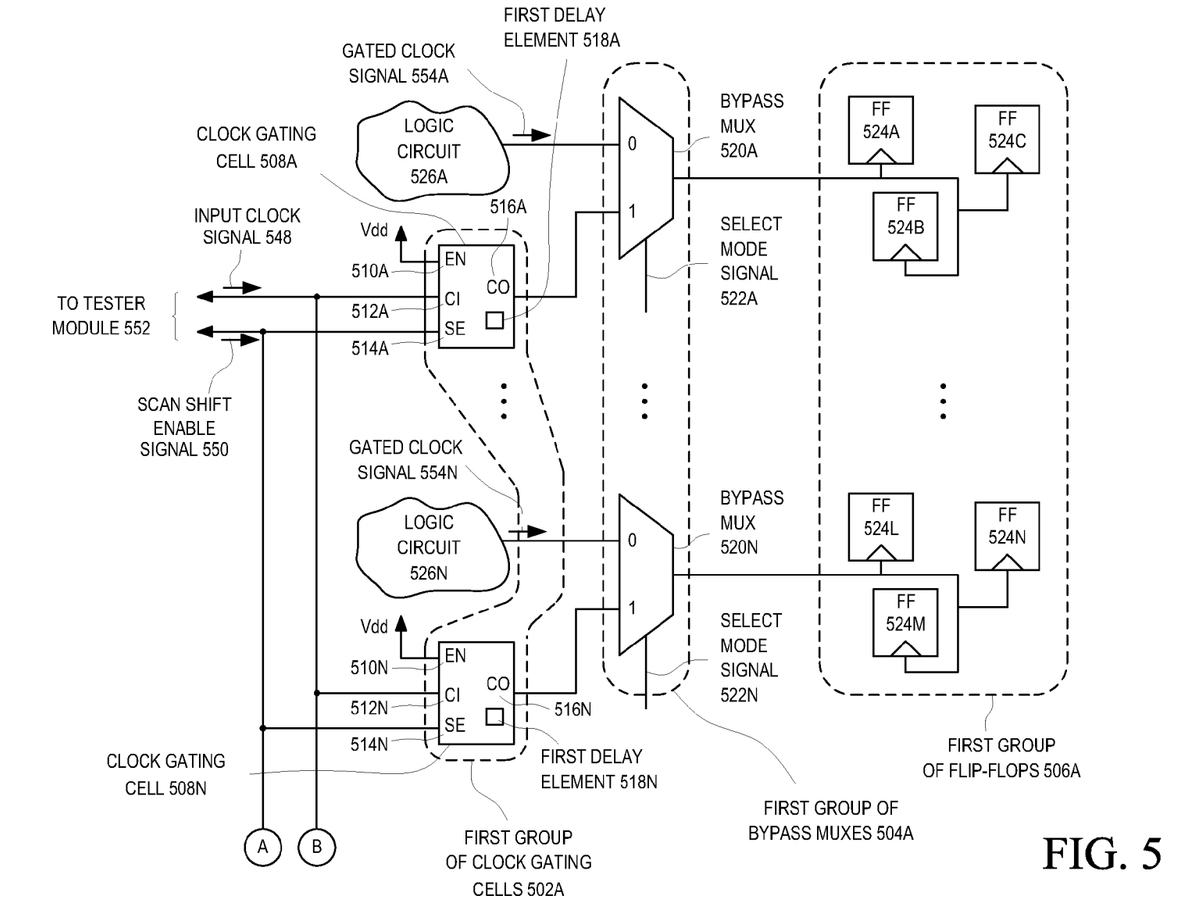
FIG. 5 illustrates another exemplary system for reducing IVD during a scan shift operation of a logic device, according to one embodiment.

FIG. 5 illustrates another exemplary system 500 for reducing IVD during a scan shift operation of a logic device, according to one embodiment. In FIG. 5, the system 500 includes a first group of clock gating cells 502A, a first group of bypass multiplexers (muxes) 504A, logic circuits 526A-N and a first group of flip-flops 506A. The system 500 also includes a second group of clock gating cells 502B, a second group of bypass multiplexers 504B, logic circuits 546A-N and a second group of flip-flops 506B.

The first group of clock gating cells 502A includes clock gating cells (CGCs) 508A-N, and the second group of clock gating cells 502B includes clock gating cells (CGCs) 528A-N. The clock gating cells 508A-N of the first group of clock gating cells 502A include first delay elements 518A-N, respectively. The clock gating cells 528A-N of the second group of clock gating cells 502B include second delay elements 538A-N, respectively. In one embodiment, the first delay elements 518A-N and the second delay elements 538A-N are programmable delay elements. In another embodiment, the first delay elements 518A-N and the second delay elements 538A-N are fixed delay elements. Although, the system 500 is shown to include the first clock gating cells 502A and the second clock gating cells 504B, it is appreciated that the system 500 may include more than two groups of clock gating cells.

Further, the first group of bypass multiplexers 504A includes bypass multiplexers 520A-N, and the second group of bypass multiplexers 504B includes bypass multiplexers 540A-N. In one embodiment, the first group of bypass multiplexers 504A and the second group of bypass multiplexers 504B may include a substantially same number of bypass multiplexers. The first group of flip-flops 506A includes flip-flops 524A-N, and the second group of flip-flops 506B includes flip-flops 544A-N. In one embodiment, the first group of flip-flops 506A and the second group of flip-flops 506B may include a substantially same number of flip-flops.

As shown, clock input (CI) pins 512A-N of the first group of clock gating cells 502A and clock input (CI) pins 532A-N of the second group of clock gating cells 502B are configured to receive an input clock signal 548. The input clock signal 548 may be a clock signal generated and forwarded by a tester module 552 (e.g., an external tester) connected to the system 500. Further, scan shift enable (SE) pins 514A-N of the first group of clock gating cells 502A are configured to receive a scan shift enable (SE) signal 550 from the tester module 552. Also, scan shift enable (SE) pins 534A-N of the second group of clock gating cells 502B are configured to receive the SE signal 550.

Further, enable (EN) pins 510A-N of the first group of clock gating cells 502A are connected to logical high ($V_{dd}$). Similarly, enable (EN) pins 530A-N of the second group of clock gating cells 502B are connected to logical high ($V_{dd}$). Furthermore, as illustrated, clock output (CO) pins 516A-N of the first group of clock gating cells 502A are coupled to the first group of bypass multiplexers 504A. Clock output (CO) pins 536A-N of the second group of clock gating cells 502B are coupled to the second group of bypass multiplexers 504B. The first group of bypass multiplexers 504A and the second group of bypass multiplexers 504B are coupled to the logic circuits 526A-N and the logic circuits 546A-N, respectively. As shown, the first group of flip-flops 506A is coupled to the first group of bypass multiplexers 504A, and the second group of flip-flops 506B is coupled to the second group of bypass multiplexers 504B.

During a normal or functional mode of operation of the logic device, the bypass multiplexers 520A-N of the first group of the bypass multiplexers 504A forwards gated clock signals 554A-N to the first group of flip-flops 506A based on select mode signals 522A-N. Further, the bypass multiplexers 540A-N of the second group of the bypass multiplexers 504B forwards gated clock signals 556A-N to the second group of flip-flops 506B. In one embodiment, the gated clock signals 554A-N are functional clock signals internally generated and fed to the first group of bypass multiplexers 504A by the logic circuits 526A-N, and the gated clock signals 556A-N are functional clock signals internally generated and fed to the second group of bypass multiplexers 504B by the logic circuits 546A-N.

During a scan shift operation of the logic device, when the SE signal 550 is logical high and when the select mode signals 522A-N are logical high, the bypass multiplexers 520A-N of the first group of bypass multiplexers 504A forward the input clock signal 548 delayed by a first duration to the first group of flip-flops 506A, where the delay of the first duration is generated by the delay elements 518A-N from the first group of clock gating cells 502A. Further, the bypass multiplexers 540A-N of the second group of bypass multiplexers 504B forward the input clock signal 548 delayed by a second duration to the second group of flip-flops 506B, where the delay of the second duration is generated by the delay elements 538A-N from the second group of clock gating cells 502B.

In the system 500, as the input clock signal 548 to the first group of flip-flops 506A is delayed by the first duration and the input clock signal 548 to the second group of flip-flops 506B is delayed by the second duration during the scan shift operation of the logic device, the flip-flops 524A-N are configured to perform their shift operations at one instance while the flip-flops 544A-N are configured to perform their respective shift operations at another instance. Subsequently, this may help significantly reduce IVD in a power grid of the logic device during its scan shift operation, thus enabling faster completion of the scan shift operation.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., complementary metal-oxide-semiconductor (CMOS) based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated circuit (ASIC)).

What is claimed is:

1. A logic device, comprising:
   a first group of clock gating cells configured to receive an input clock signal, wherein each clock gating cell of the first group of clock gating cells comprises a first delay element configured to delay the input clock signal by a first duration during a scan shift operation of the logic device, wherein the first delay element comprises a first programmable delay element configured to set the first duration based on a first programmable delay input;
   a first group of flip-flops coupled to the first group of clock gating cells;
   a second group of clock gating cells configured to receive the input clock signal, wherein each clock gating cell of the second group of clock gating cells comprises a second delay element configured to delay the input clock signal by a second duration, different from the first duration, during the scan shift operation, wherein the second delay element comprises a second programmable delay element configured to set the second duration based on a second programmable delay input;
   a second group of flip-flops coupled to the second group of clock gating cells, wherein the first group of flip-flops and the second group of flip-flops are configured to receive the input clock signal delayed by the first duration and the input clock signal delayed by the second duration, respectively, during the scan shift operation; and
   a feedback circuit coupled to the first delay element and to the second delay element and configured to generate the first programmable delay input and the second programmable delay input based on instantaneous voltage droop (IVD) associated with the scan shift operation.

2. The logic device of claim 1, wherein each of the first group of clock gating cells comprises:
   an AND gate configured to receive a functional mode enable signal and the input clock signal; and
   a multiplexer coupled to the AND gate and the first delay element and configured to select the input clock signal delayed by the first duration during the scan shift operation.

3. The logic device of claim 1, wherein each of the second group of clock gating cells comprises:
   an AND gate configured to receive a functional mode enable signal and the input clock signal; and
   a multiplexer coupled to the AND gate and the second delay element and configured to select the input clock signal delayed by the second duration during the scan shift operation.

4. The logic device of claim 1, wherein a number of the first group of flip-flops is equal to a number of the second group of flip-flops.

5. The logic device of claim 1, wherein the feedback circuit comprises:
   a voltage sensor configured to detect the IVD during the scan shift operation;
   a plurality of programmable registers configured to store at least one threshold value associated with the IVD; and
   a state machine coupled to the voltage sensor and to the plurality of programmable registers and configured to generate the first programmable delay input and the second programmable delay input based on the IVD and the at least one threshold value associated with the IVD.

6. The logic device of claim 1, wherein each of the first delay element and the second delay element comprises a delay buffer.

7. The logic device of claim 1, wherein the input clock signal is generated and forwarded by a tester module.

8. The logic device of claim 1, further comprising:
   a first group of bypass multiplexers coupled to the first group of clock gating cells and configured to forward the input clock signal delayed by the first duration during the scan shift operation to the first group of flip-flops; and
   a second group of bypass multiplexers coupled to the second group of clock gating cells and configured to forward the input clock signal delayed by the second duration during the scan shift operation to the second group of flip-flops coupled to the second group of bypass multiplexers, wherein the first group of flip-flops and the second group of flip-flops are configured to receive the input clock signal delayed by the first duration and the input clock signal delayed by the second duration, respectively, during the scan shift operation.

9. The logic device of claim 8, wherein each multiplexer of the first group of bypass multiplexers and the second group of bypass multiplexers is configured to forward a gated clock signal internally generated by a respective logic circuit during a normal operation mode of the logic device.

10. The logic device of claim 8, wherein each of the first group of clock gating cells comprises:
   an AND gate configured to receive a functional mode enable signal and the input clock signal; and
   a multiplexer coupled to the AND gate and to the first delay element and configured to select the input clock signal delayed by the first duration during the scan shift operation.

11. The logic device of claim 10, wherein each of the first group of clock gating cells is configured to forward the input clock signal during a scan capture operation of the logic device.

12. The logic device of claim 8, wherein each of the second group of clock gating cells comprises:
   an AND gate configured to receive a functional mode enable signal and the input clock signal; and
   a multiplexer coupled to the AND gate and to the second delay element and configured to select the input clock signal delayed by the second duration during the scan shift operation.

13. The logic device of claim 12, wherein each of the second group of clock gating cells is configured to forward the input clock signal during a scan capture operation of the logic device.

14. The logic device of claim 8, wherein a number of the first group of flip-flops is equal to a number of the second group of flip-flops.

15. A method for reducing instantaneous voltage droop (IVD) during a scan shift operation of a logic device, comprising:
   (a) delaying an input clock signal by a first duration during the scan shift operation to generate a first delayed clock signal;
   (b) driving a first group of flip-flops using the first delayed clock signal during the scan shift operation;
   (c) delaying the input clock signal by a second duration, different from the first duration, during the scan shift operation to generate a second delayed clock signal;
   (d) driving a second group of flip-flops using the second delayed clock signal during the scan shift operation;
   (e) programmably setting the first and second durations; and
   (f) monitoring feedback based on operations of the first and second groups of flip-flops to dynamically adjust at least one of the first and second durations to reduce the IVD.

16. The method of claim 15, wherein the monitoring comprises measuring voltage representative of the IVD associated with the scan shift operation.

17. The method of claim 16, wherein:
   a voltage sensor detects the IVD during the scan shift operation;
   a plurality of programmable registers store at least one threshold value associated with the IVD; and
   a state machine, coupled to the voltage sensor and to the plurality of programmable registers, generates the first programmable delay input and the second programmable delay input based on the IVD and the at least one threshold value associated with the IVD.

18. The method of claim 15, further comprising performing a scan capture operation on the first and second groups of flip-flops using the input clock signal without delay.

* * * * *